(12) United States Patent
Adusumilli et al.

(10) Patent No.: US 9,997,453 B2
(45) Date of Patent: Jun. 12, 2018

(54) ANTIFUSE HAVING COMB-LIKE TOP ELECTRODE

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/653,592

(22) Filed: Jul. 19, 2017

(65) Prior Publication Data

US 2017/0345757 A1    Nov. 30, 2017

Related U.S. Application Data

(62) Division of application No. 15/164,210, filed on May 25, 2016, now Pat. No. 9,786,595.

(51) Int. Cl.
*H01L 23/52* (2006.01)
*H01L 23/525* (2006.01)

(52) U.S. Cl.
CPC .................. *H01L 23/5252* (2013.01)

(58) Field of Classification Search
CPC .................................................. H01L 23/5252
See application file for complete search history.

(56) References Cited

U.S. PATENT DOCUMENTS

| | | | |
|---|---|---|---|
| 5,365,105 A * | 11/1994 | Liu | H01L 23/5252 257/390 |
| 5,789,795 A | 8/1998 | Sanchez et al. | |
| 6,103,555 A * | 8/2000 | Choi | H01L 23/5252 257/E23.147 |
| 6,124,194 A | 9/2000 | Shao et al. | |
| 6,251,710 B1 | 6/2001 | Radens et al. | |
| 6,335,228 B1 | 1/2002 | Fuller et al. | |
| 6,794,726 B2 | 9/2004 | Radens et al. | |
| 7,276,751 B2 | 10/2007 | Ho et al. | |
| 8,159,042 B2 | 4/2012 | Yang et al. | |
| 8,294,505 B2 | 10/2012 | Chen et al. | |
| 8,699,290 B2 | 4/2014 | Kim | |
| 8,916,919 B2 | 12/2014 | Thompson et al. | |
| 2003/0198109 A1* | 10/2003 | Sakoh | G11C 17/16 365/200 |
| 2008/0012138 A1* | 1/2008 | Wang | H01L 23/5252 257/758 |
| 2010/0032732 A1 | 2/2010 | Booth, Jr. et al. | |
| 2010/0176366 A1* | 7/2010 | Fu | H01L 27/101 257/4 |

(Continued)

*Primary Examiner* — Victor A Mandala
(74) *Attorney, Agent, or Firm* — Daniel P. Morris, Esq.; Otterstedt, Ellenbogen & Kammer, LLP

(57) ABSTRACT

Antifuse structures are provided for use in applications such as field programmable gate arrays and programmable read-only memories. High aspect ratio channels within an antifuse dielectric layer are used to form antifuse electrode projections. The projections are configured to enhance the electric field across the antifuse structures, thereby facilitating dielectric breakdown. The antifuse structures can enable low-voltage programming.

7 Claims, 4 Drawing Sheets

(56) References Cited

U.S. PATENT DOCUMENTS

| | | |
|---|---|---|
| 2012/0032136 A1* | 2/2012 | Redaelli .............. H01L 27/2445 |
| | | 257/5 |
| 2012/0129340 A1 | 5/2012 | Kane et al. |
| 2012/0249160 A1 | 10/2012 | Chakravarti et al. |
| 2013/0153960 A1* | 6/2013 | Yang ................... H01L 23/5252 |
| | | 257/183 |
| 2014/0210043 A1 | 7/2014 | Wang et al. |
| 2016/0233222 A1* | 8/2016 | Lee ....................... H01L 23/525 |

* cited by examiner

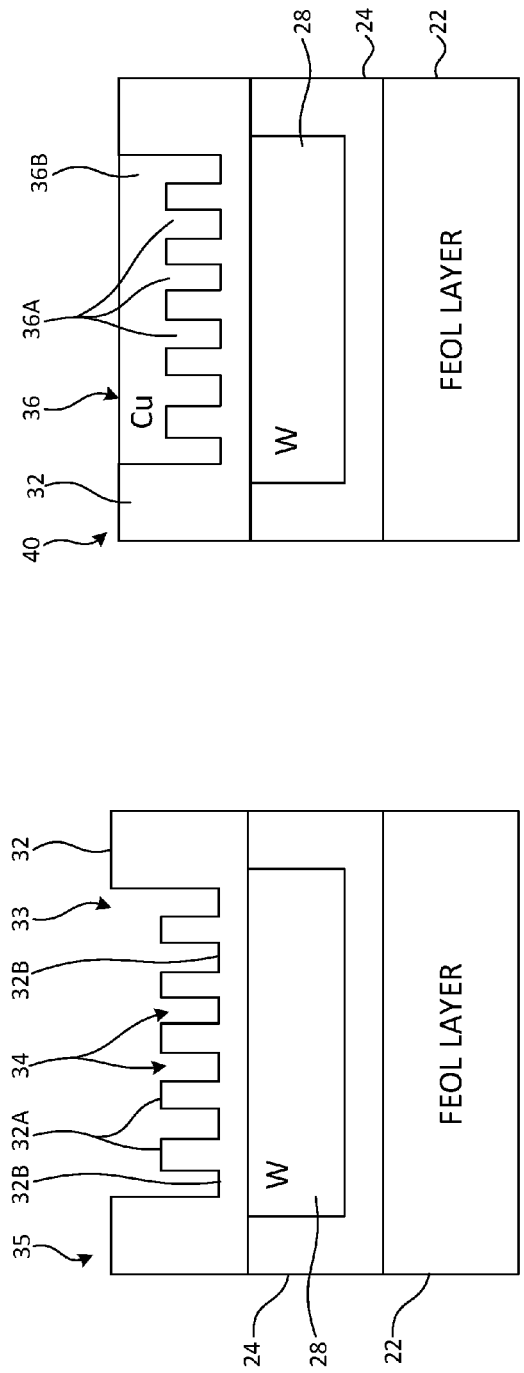
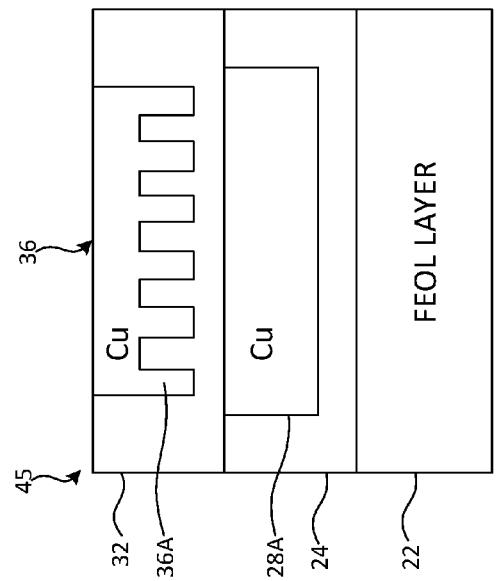

ANTIFUSE HAVING COMB-LIKE TOP ELECTRODE

CROSS-REFERENCE TO RELATED APPLICATIONS

This patent application is a divisional of U.S. patent application Ser. No. 15/164,210 filed May 25, 2016, entitled "ANTIFUSE HAVING COMB-LIKE TOP ELECTRODE." The complete disclosure of the aforementioned U.S. patent application Ser. No. 15/164,210, now U.S. Pat. No. 9,786,595, is expressly incorporated herein by reference in its entirety for all purposes.

BACKGROUND

The present disclosure relates to the electrical, electronic, and computer arts, and, more particularly, to electrical antifuses for use in the semiconductor industry.

Antifuse structures have been used in the semiconductor industry for memory-related applications such as filed programmable gate arrays and programmable read-only memories. Such structures typically include a material that initially has a high electrical resistance but can be converted into a lower electrical resistance. After a high voltage programming process, the device/circuit becomes electrically conductive/open through a dielectric breakdown phenomenon. Once programmed, the programmed state of an electrical antifuse or fuse does not revert to its original state. In other words, the programmed state is intended to be irreversible. An antifuse is typically fused by applying a sufficient voltage across the antifuse structure. The voltage causes the structure to fuse together, resulting in the permanent "open" state.

The breakdown of a dielectric layer such as an oxide by the application of a sufficient electric field is one technique for forming an antifuse. Prior to programming, the integrity of the dielectric layer is maintained and the antifuse structure exhibits high electrical resistance. The application of a high dielectric field across the two electrodes of the antifuse that adjoin the dielectric layer induces a rupture, thereby causing reduction of the electrical resistance across the two electrodes.

SUMMARY

Embodiments of the present disclosure provide allow the programming of a device using relatively low power applied to antifuse structures.

A method is provided for forming a semiconductor structure including one or more antifuse structures. The method includes obtaining a structure including a device layer comprising electronic semiconductor devices and a first dielectric layer on the device layer. A bottom electrode is formed within the first dielectric layer and an antifuse dielectric layer is formed on the bottom electrode. A recess is formed within the antifuse dielectric layer. A plurality of channels are formed within the antifuse dielectric layer, the channels extending from the recess towards the bottom electrode. The recess and channels within the antifuse dielectric layer are filled with an electrically conductive material to form a top electrode including projections filling the channels. The top electrode, the bottom electrode and the antifuse dielectric layer form an antifuse structure for programming of the device layer.

Additional aspects of the disclosure are directed to a semiconductor structure including a device layer comprising electronic semiconductor devices, a first dielectric layer on the device layer, and an antifuse structure electrically connected to the device layer. The antifuse structure includes a bottom electrode adjoining the first dielectric layer, a top electrode including a plurality of projections extending towards the bottom electrode, and an antifuse dielectric layer between the bottom electrode and the top electrode, the antifuse dielectric layer including a plurality of channels containing the plurality of projections.

BRIEF DESCRIPTION OF THE DRAWINGS

These and other features, aspects, and advantages of the present invention will become better understood with regard to the following description, appended claims, and accompanying drawings where:

FIG. 6 shows a sectional view of an intermediate film stack wherein the antifuse dielectric layer is patterned subsequent to obtaining the film stack shown in FIG. 3 while performing the FIG. 1 method;

FIG. 7 shows a sectional view of a film stack having an antifuse structure including a metal fill layer that is formed subsequent to obtaining the film stack shown in FIG. 6 while performing the FIG. 1 method;

FIG. 8 shows a sectional view of an alternative embodiment of a film stack including an antifuse structure that can be formed performing the FIG. 1 method;

In the sectional views included herein, features present behind the sectional planes are not shown to reduce clutter and enhance clarity.

DETAILED DESCRIPTION

The subject matter of the instant application will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus twenty percent.

Figure 1:
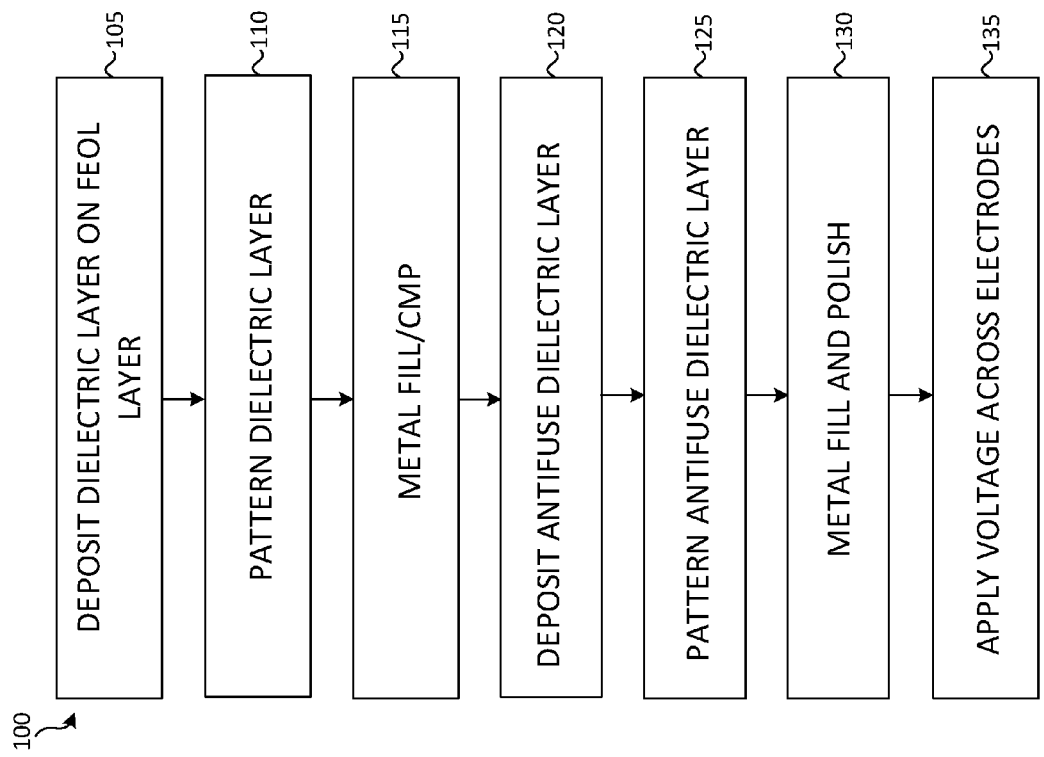
FIG. 1 shows an exemplary method for fabricating an antifuse structure.

FIG. 1 shows a flow diagram of a method 100 for fabricating and programming an electrical antifuse structure. Although the method 100 and the structures formed thereby are entirely novel, many of the individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, James D. Plummer et al., *Silicon VLSI Technology: Fundamentals, Practice, and Modeling* 1st Edition, Prentice Hall, 2001; S. Wolf and R. N. Tauber, *Silicon Processing for the VLSI Era, Volume* 1, Lattice Press, 1986; S. Wolf, *Silicon Processing for the VLSI Era, Vol.* 4: *Deep-Submicron Process Technology*, Lattice Press, 2003; and S. M. Sze, *VLSI Technology, Second Edition*, McGraw-Hill, 1988, all of which are incorporated by reference herein. It is also emphasized that the descriptions provided herein are not intended to encompass all of the processing steps that may be required to successfully form a functional device. Rather, certain processing steps that are conventionally used in forming integrated circuit devices, such as, for example, wet cleaning steps, are purposefully not described herein for economy of description. However, one skilled in the art will readily recognize those processing steps omitted from this more generalized description.

Figure 2:
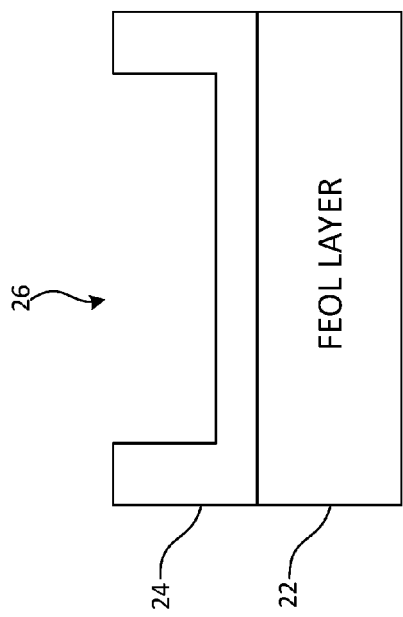
FIG. 2 shows a sectional view of an intermediate film stack including a dielectric layer deposited on a layer comprising semiconductor devices that is formed while performing the FIG. 1 method.
Figure 3:
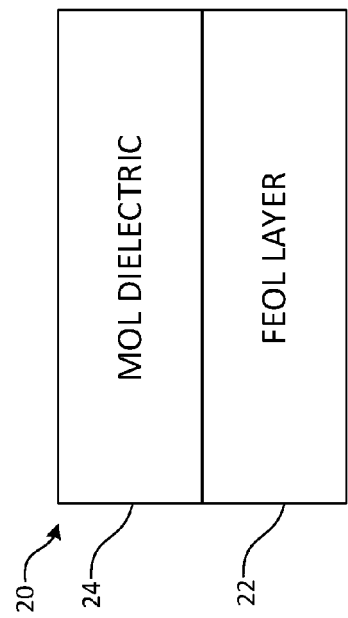
FIG. 3 shows a sectional view of an intermediate film stack including a patterned dielectric layer that is formed subsequent to obtaining the film stack shown in FIG. 2 while performing the FIG. 1 method.

Before the method 100 is started, the first portion of integrated circuit (IC) processing is conducted in a manner consistent with CMOS process flow to obtain a layer 22 as shown in FIG. 2 including wafer-based electrical devices (not shown) such as transistors (for example MOSFETs), capacitors and diodes. Such "front-end-of-line" (FEOL) processing is well known in the art and continues to be developed. Typical FEOL processes include, for example, wafer preparation, electrical isolation, well formation, gate patterning, spacer formation, extension and source/drain implantation, silicide formation, and dual stress liner formation. Middle-of-line (MOL) processing includes steps typically used for fabricating metal contacts for logic circuitry components such as field-effect transistors (FETs), resistors, diodes, and capacitors. Back-end-of-line (BEOL) processing involves the creation of metal interconnecting wires that connect the devices formed in FEOL processing to form electrical circuits. The wires are electrically isolated by dielectric layers.

A thin barrier layer (not shown), which is typically about 25-75 nm thick and which comprises, for example, silicon nitride, is deposited over the FEOL layer 22. This is followed by deposition of one or more dielectric layers and one or more capping layers in step 105, forming the MOL dielectric layer 24. The MOL dielectric layer 24, including the capping layer(s), may contain any suitable dielectric material(s), including, but not limited to: silicon dioxide, silicon nitride, silicon oxynitride, boron doped phosphorus silicate glass (BPSG), and phosphosilicate glass (PSG). In some embodiments, the MOL dielectric layer(s) and the capping layer(s) contain BPSG or undoped low temperature oxide that is formed by any suitable dielectric deposition processes, including, but not limited to: high density plasma deposition (HDP) or plasma-enhanced chemical vapor deposition (PECVD). The MOL dielectric/capping layer(s) typically function to act as barriers between the transistors in the FEOL layer 22 and metal layers to be deposited subsequently, so as to prevent migration of the metal species into active regions of the transistors and to protect the transistors against potential metal contamination. The layer may also function as a mask for forming deep trenches in the semiconductor substrate of the FEOL layer for subsequent fabrication of the trench capacitors. The MOL dielectric layer 24 may have a thickness ranging from about 5000 Å to about 7000 Å or greater, depending on the specific application requirements to provide a dielectric cover for the transistors or other logic circuitry components comprising the FEOL layer 22 during and metal contact fabrication process.

Step 110 involves the formation of trench openings 26 in the MOL dielectric layer 24 by using photolithography and etching steps typically used for forming trenches and/or metal contact holes or vias in a conventional middle-of-line process. Specifically, a photoresist (not shown) is applied over the MOL dielectric layer 24. The photoresist can be applied by any suitable technique, including, but not limited to coating or spin-on techniques. A mask (not shown), which is patterned with shapes defining trench openings (and possibly contact holes) to be formed, is provided over the photoresist, and the mask pattern is transferred to the photoresist using a photolithographic process, which creates recesses in the uncovered regions of the photoresist. The patterned photoresist is subsequently used to create the same pattern of recesses in the MOL dielectric layer through conventional etching typically used for forming trenches and contact holes. The etching selectively removes a portion of the MOL dielectric layer and stops above the FEOL layer 22. The depth of the trench opening 26 can be controlled by using a timed etching process. Alternatively, the dielectric layer 24 may include multiple layers that may be selectively etched. In such a case, the etch process selectively removes the upper layer(s) of the MOL dielectric layer 24, stopping at a lower layer thereof that adjoins the FEOL layer 22 and forms an etch stop. After formation of the trench opening 26, the photoresist may be stripped by ashing or other suitable process from the MOL dielectric layer 24.

Figure 4:
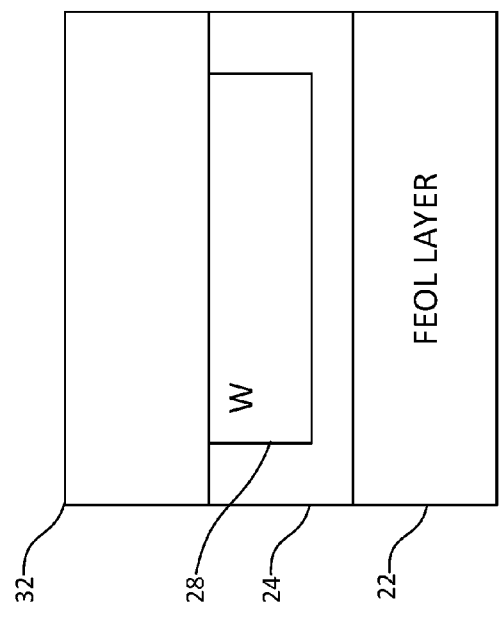
FIG. 4 shows a sectional view of an intermediate film stack including a metal fill layer that is formed subsequent to obtaining the film stack shown in FIG. 3 while performing the FIG. 1 method.

Step 115 includes the deposition of a metal fill followed by chemical mechanical polishing (CMP). The metal fill within the trench opening 26 forms a bottom electrode 28 of an antifuse structure that is later completed. FIG. 4 schematically illustrates an exemplary intermediate structure 30 following deposition of a tungsten (W) fill and CMP. A liner/barrier film layer (not shown), for example titanium/titanium nitride (TiN), is conformally deposited on the structure prior to deposition of the metal fill using, for example, an ALD process. The electrically conductive fill layer can be deposited by physical vapor deposition, chemical vapor deposition, and/or electroplating. The fill layer can, for example, be an aluminum layer, a tungsten layer, an aluminum alloy layer, a tungsten alloy layer, or other metals. As discussed further below, copper (Cu) is employed as a metal fill in some embodiments. Tungsten can be deposited by chemical vapor deposition.

Step 120 includes the deposition of an antifuse dielectric layer 32 on the structure 30. The antifuse dielectric layer 32 is formed from a low-k dielectric material. Such low-k dielectric materials are often employed during BEOL processing, and include silicon oxycarbide (SiCOH) materials, SiLK® polymers and other materials. Low-k dielectric materials are understood as having a dielectric constant that is less than the dielectric constant of silicon oxide of 3.9. The antifuse dielectric layer has a dielectric constant of three or less in some exemplary embodiments. The low-k dielectric material layer may be formed by methods well known in the art. SiLK® thermosetting polymer may, for example, be applied by spin coating and is planarized following curing.

Figure 5:
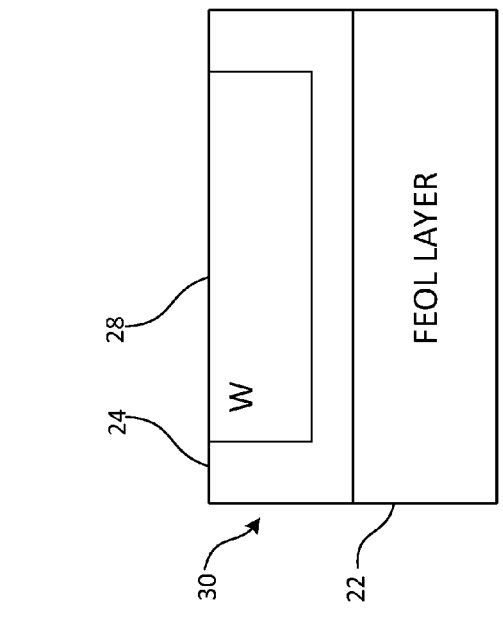
FIG. 5 shows a sectional view of an intermediate film stack including an antifuse dielectric layer that is formed subsequent to obtaining the film stack shown in FIG. 4 while performing the FIG. 1 method.

Chemical vapor deposition (CVD), including plasma-enhanced CVD, is a further technique often used for the deposition of low-k dielectric materials, such as SiCOH. FIG. 5 schematically illustrates the structure following deposition of the antifuse dielectric layer 32.

The antifuse dielectric layer 32 is patterned in step 125. A recess 33 is formed in this layer followed by the formation of high aspect ratio channels 34 in the remaining portion of the layer. The aspect ratio (depth to width) of the high aspect ratio channels 34 is between one and six in the exemplary embodiments. In one or more embodiments, patterning includes conventional deposition, photolithographic, and anisotropic etching steps, first to form the recess 33 and then to form the channels 34. A hard mask layer (not shown) and a photoresist layer (not shown) are applied over the top surface of the antifuse dielectric layer 32 (first as shown in FIG. 5, later following formation of the recess 33) and lithographically patterned by exposure and development. The photoresist may be a block level photoresist that typically employs mid-ultraviolet (MUV) lithography for exposure and development. Alternately, the photoresist may be any other type of photoresist such as a deep-ultraviolet (DUV) photoresist, extreme-ultraviolet (EUV) photoresist, or electron beam resist. Employing the remaining portion of the photoresist layer or hard mask layer as an etch mask, the exposed portions of the antifuse dielectric layer 32 is removed by an etch. The etch may be a dry etch such as a reactive ion etch (ME). A fluorocarbon/fluorine-based etch is an exemplary etch that can be employed in step 125. The photoresist is then be stripped by ashing or other suitable process and the hard mask is removed. As schematically illustrated in FIG. 6, the patterned antifuse dielectric layer includes the recess 33 and a plurality of vertical, high aspect ratio channels 34 extending therein, the aspect ratio being at least one. Timed etches are employed in some embodiments to form the recess and channels to selected depths. The bottom ends of the channels 34 are above the bottom electrode 28, leaving a dielectric region 32B beneath each channel. The trenches have substantially vertical sidewalls, depths between ten and two hundred nanometers (10-200 nm) and widths between ten and one hundred nanometers (10-100 nm) in some embodiments, the widths being preferably between twenty and fifty nanometers (20-50 nm). The dielectric region 32B separating the bottom of each channel from the bottom electrode 28 is between five and one hundred nanometers, preferably between ten and twenty nanometers (10-20 nm) in thickness in some embodiments. The thicknesses of the dielectric regions 32B may be larger or smaller depending on the particular dielectric material chosen for the antifuse dielectric layer 32. The dielectric columns 32A between each channel 34 have widths between about ten and fifty nanometers (10-50 nm) in some exemplary embodiments.

Following the formation of the intermediate structure 35 shown in FIG. 6, step 130 is performed to obtain the interfuse structure included as part of the semiconductor structure 40 schematically illustrated in FIG. 7. A second metal fill process is conducted followed by chemical mechanical planarization. In some embodiments, a copper electrode 36 is formed as the top electrode. Copper, if used, may be deposited using, for example, chemical vapor deposition, physical vapor deposition plus reflow, or electrochemical deposition as used in the damascene process. As known in the art, one or more barrier layers (e.g. tantalum-based layers) may be deposited prior to the copper fill. The copper fills the recess 33 and channels 34 formed in the low-k dielectric layer. The resulting electrode 36 accordingly has a comb-like cross-sectional configuration with elongate projections 36A extending downwardly towards the dielectric regions 32B at the bottoms of the channels 34. Chemical mechanical polishing (CMP) follows metal deposition to complete the structure shown in FIG. 7. In an alternative embodiment, the method 100 substantially as described is employed to obtain the semiconductor structure 45 shown in FIG. 8. The bottom electrode 28A of the interfuse structure incorporated within the semiconductor structure 45 is copper rather than tungsten. Step 115 accordingly includes the deposition of copper (Cu) as opposed to tungsten.

Thus, the method 100 is operative to effectively provide one or more antifuses to facilitate the programming of integrated circuits formed on semiconductor substrates. Programming voltage is a function of the dimensions of the electrodes. The programming of advanced, low-power devices becomes feasible using the method 100 as the electrical field is highly magnified at the bottoms of the high aspect ratio channels 34 that contain the metal projections of the top electrode of the interfuse structures. A relatively high electrical field can accordingly be created across the antifuse dielectric layer, facilitating its breakdown and the establishment of an electrically conductive pathway. Step 135 involves the application of sufficient voltage to the interfuse structure incorporated within structures 40 and 45 illustrated in FIGS. 7 and 8, respectively, to electrically connect two electrical circuits. The semiconductor structures 40, 45 comprise field programmable gate arrays in some embodiments and programmable read-only memories in other embodiments. The antifuse structures as disclosed can be employed in any semiconductor structure that benefits from the presence of antifuses.

Figure 10:
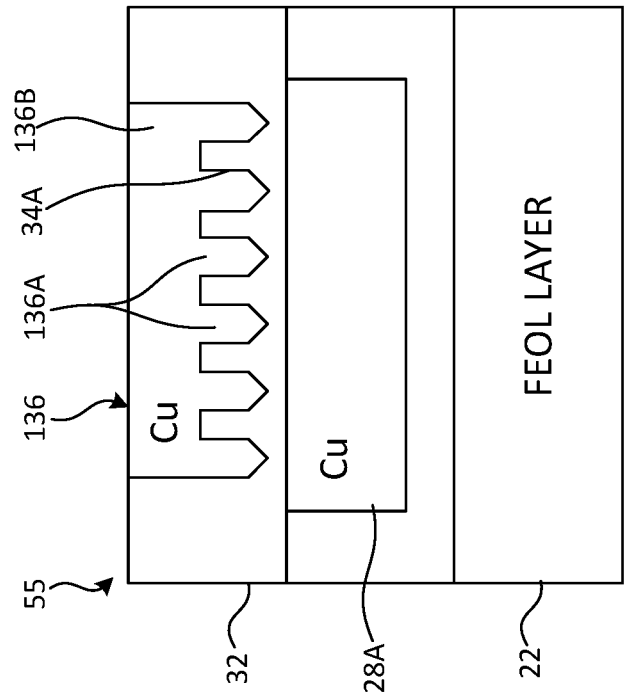
FIG. 10 shows a sectional view of an alternative embodiment of a film stack including an antifuse structure that can be formed while performing the alternative embodiment of the FIG. 1 method.
Figure 9:
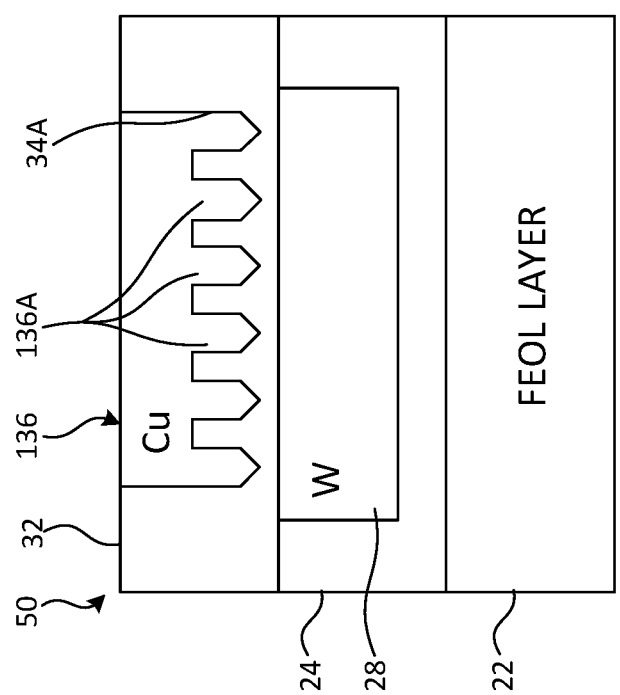
FIG. 9 shows a sectional view of a film stack including an antifuse structure that can be formed performing an alternative embodiment of the FIG. 1 method.

FIGS. 9 and 10 schematically illustrate a further pair of film stacks 50, 55 including interfuse structures that facilitate low power programming. The same reference numerals are used in FIGS. 9 and 10 to designate elements that are substantially the same as those described with respect to the previous figures. The top electrode 136 of each interfuse structure includes elongate projections 136A extending from a body portion 136B. The body portion and projections are formed, respectively, in a recess and within high aspect ratio channels 34A in the antifuse dielectric layer 32. Each channel 34A and projection therein includes a tapered end portion that facilitates dielectric breakdown upon the application of a programming voltage. Channels 34A having tapered end portions are formed in the antifuse dielectric layer by the re-sputtering of liner material by argon ions prior to copper deposition, thereby narrowing the channels 34A at the bottom ends.

Given the discussion thus far and with reference to the exemplary embodiments discussed above and the drawings, it will be appreciated that, in general terms, an exemplary fabrication method for forming a semiconductor structure including one or more antifuse structures includes obtaining a structure 20 including a device layer comprising electronic semiconductor devices and a first dielectric layer 24 on the device layer. As discussed above, the FEOL layer 22 includes electrical devices formed on a semiconductor substrate, thereby including a device layer. A bottom electrode 28 is formed within the first dielectric layer 24 and an antifuse dielectric layer 32 is formed on the bottom electrode 28. A recess 33 and a plurality of channels are formed within the antifuse dielectric layer, the channels 34 extending from the recess 33 towards the bottom electrode 28. The recess and channels within the antifuse dielectric layer are filled with an electrically conductive material to form a top electrode 36 including projections 36A filling the channels such that the top electrode 36, the bottom electrode 28 and the antifuse dielectric layer 32 form an antifuse structure for programming of the device layer. The channels 34 and top electrode projections 36A contained therein have depth dimensions and width dimensions, the depth dimensions exceeding the width dimensions in exemplary embodiments. The width dimension of each channel 34 is between ten and one hundred nanometers in one or more embodiments. In some embodiments of the method, the width dimension of each channel 34 formed in the antifuse dielectric layer is between about twenty and fifty nanometers (20-50 nm). The projections 36A of the top electrode 36 have bottom surfaces spaced about ten to twenty nanometers from the bottom electrode 28 in some embodiments. The dielectric region 32B separating the bottom of each channel (and top electrode projection 36A) from the top surface of the bottom electrode 28 is accordingly in this range in such embodiments. The method may further include applying a programming voltage across the antifuse structure to decrease the electrical resistance of the antifuse structure. The antifuse dielectric layer 32 comprises a low-k material having a dielectric constant of less than three in some embodiments, such as SiLK or SiCOH. The antifuse dielectric layer may consist essentially of low-k material. In some embodiments, such as illustrated in FIG. 7, the top electrode 36 consists essentially of a first metal and the bottom electrode consists essentially of a second metal, the first metal being different from the second metal. The first metal is copper in some embodiments and the second metal is tungsten. In some embodiments, the device layer comprises at least one of a field programmable gate array and a programmable read-only memory. In some embodiments of the method, forming the bottom electrode 28 includes forming a trench 26 within the first dielectric layer 24, filling the trench with an electrically conductive material, and subjecting the electrically conductive material to chemical mechanical polishing. Forming the plurality of channels within the antifuse dielectric layer 32 may further include forming inwardly tapered bottom portions of the channels 34A, such as shown in FIGS. 9 and 10.

With further reference to the exemplary embodiments discussed above and the drawings, an exemplary semiconductor structure includes a device layer comprising electronic semiconductor devices, a first dielectric layer 24 on the device layer, and an antifuse structure electrically connected to the device layer. The antifuse structure includes a bottom electrode 28 (or 28A) adjoining the first dielectric layer 24 and a top electrode 36 (or 136) including a plurality of projections 36A (or 136A) extending towards the bottom electrode. An antifuse dielectric layer is between the bottom electrode and the top electrode. The antifuse dielectric layer including a plurality of channels 34 (or 34A) containing the plurality of the top electrode projections. Exemplary semiconductor structures including such antifuse structures are schematically illustrated in FIGS. 7-10. The semiconductor structure may further including a recess 33 within the antifuse dielectric layer, the plurality of channels 34 (or 34A) extending from the recess towards the bottom electrode, wherein the antifuse structure includes a body portion 36B (or 136B) within the recess, the plurality of projections 36A (or 136A) extending from the body portion. In some embodiments, the semiconductor structure further includes a trench 26 within the first dielectric layer 24, the bottom electrode 28 (or 28A) being positioned within the trench. The projections extending from the body portion of the top electrode 36 (or 136) may have bottom surfaces spaced about ten to twenty nanometers from the bottom electrode. The antifuse dielectric layer comprises a low-k material having a dielectric constant of less than three in some embodiments. The top electrode of the antifuse structure consists essentially of a first metal and the bottom electrode thereof consists essentially of a second metal, the first metal being different from the second metal in some embodiments. In other embodiments, both antifuse electrodes consist essentially of the same materials, for example copper. In some embodiments, the top electrode projections 136A include inwardly tapered bottom portions as schematically illustrated in FIGS. 9 and 10.

The methods described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices, and a central processor. These integrated circuits and end products would also fall within the scope of the disclosed subject matter.

The above-described embodiments of the invention are intended to be illustrative only. Other embodiments may, for example, utilize different materials and processing steps from those expressly set forth above to achieve embodiments falling within the scope of the invention. These many alternative embodiments will be apparent to one having ordinary skill in the relevant arts.

All the features disclosed herein may be replaced by alternative features serving the same, equivalent, or similar purposes, unless expressly stated otherwise. Thus, unless expressly stated otherwise, each feature disclosed is one example only of a generic series of equivale The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

What is claimed is:

1. A semiconductor structure comprising:
   a device layer comprising electronic semiconductor devices;
   a first dielectric layer on the device layer, and
   an antifuse structure electrically connected to the device layer, the antifuse structure including:
      a bottom electrode adjoining the first dielectric layer;
      a top electrode including a plurality of projections extending towards the bottom electrode, and
      an antifuse dielectric layer between the bottom electrode and the top electrode, the antifuse dielectric layer including a plurality of channels containing the plurality of projections.

2. The semiconductor structure of claim 1, further including a recess within the antifuse dielectric layer, the plurality of channels extending from the recess towards the bottom electrode, the antifuse structure including a body portion within the recess, the plurality of projections extending from the body portion.

3. The semiconductor structure of claim 2, further including a trench within the first dielectric layer, the bottom electrode being positioned within the trench.

4. The semiconductor structure of claim 2, wherein the projections extending from the body portion of the top electrode have bottom surfaces spaced about ten to twenty nanometers from the bottom electrode.

5. The semiconductor structure of claim 2, wherein the antifuse dielectric layer comprises a low-k material having a dielectric constant of less than three.

6. The semiconductor structure of claim 2, wherein the top electrode consists essentially of a first metal and the bottom electrode consists essentially of a second metal, the first metal being different from the second metal.

7. The semiconductor structure of claim 2, wherein the projections include inwardly tapered bottom portions.

* * * * *